(12) United States Patent
Okada

(10) Patent No.: US 7,255,586 B2
(45) Date of Patent: Aug. 14, 2007

(54) CONNECTOR DEVICE

(75) Inventor: Yoshikatsu Okada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 11/358,121

(22) Filed: Feb. 22, 2006

(65) Prior Publication Data

US 2006/0189195 A1 Aug. 24, 2006

(30) Foreign Application Priority Data

Feb. 23, 2005 (JP) ............................. 2005-046867

(51) Int. Cl.
*H01R 13/625* (2006.01)
(52) U.S. Cl. ...................... 439/346; 439/636
(58) Field of Classification Search ................ 439/346, 439/630–637, 59–62, 65, 66
See application file for complete search history.

(56) References Cited

U.S. PATENT DOCUMENTS

| | | | | |
|---|---|---|---|---|
| 3,140,907 A | * | 7/1964 | Davies ...................... | 439/59 |
| 3,550,069 A | * | 12/1970 | Teagno et al. ............... | 439/849 |
| 3,858,957 A | * | 1/1975 | Harwood et al. ............. | 439/59 |
| 3,982,807 A | * | 9/1976 | Anhalt et al. ................ | 439/260 |
| 4,018,495 A | * | 4/1977 | Freitag ........................ | 439/55 |
| 4,054,742 A | * | 10/1977 | Bonhomme .................. | 174/261 |
| 4,080,027 A | * | 3/1978 | Benasutti ..................... | 439/260 |
| 4,095,866 A | * | 6/1978 | Merrill ......................... | 439/60 |
| 4,129,351 A | * | 12/1978 | Sugimoto et al. ............ | 439/325 |
| 4,288,139 A | * | 9/1981 | Cobaugh et al. ............. | 439/267 |
| 4,298,237 A | * | 11/1981 | Griffith et al. ................ | 439/60 |
| 4,303,291 A | * | 12/1981 | Dines ........................... | 29/843 |
| 4,806,103 A | * | 2/1989 | Kniese et al. ................. | 439/60 |
| 4,820,186 A | * | 4/1989 | Fujii ............................ | 439/326 |
| 4,991,666 A | * | 2/1991 | Septfons et al. ............. | 174/261 |
| 5,037,315 A | * | 8/1991 | Collier et al. ................. | 439/83 |
| 5,040,991 A | * | 8/1991 | Collier ......................... | 439/60 |
| 5,040,999 A | * | 8/1991 | Collier ......................... | 439/108 |
| 5,051,099 A | * | 9/1991 | Pickles et al. ............... | 439/108 |
| 5,096,435 A | * | 3/1992 | Noschese et al. ............ | 439/260 |
| 5,160,275 A | * | 11/1992 | Nakamura et al. ........... | 439/328 |
| 5,205,738 A | * | 4/1993 | Anderson et al. ............ | 439/59 |
| 5,236,372 A | * | 8/1993 | Yunoki et al. ................ | 439/260 |
| 5,238,411 A | * | 8/1993 | Jinno et al. ................... | 439/59 |
| 5,259,767 A | * | 11/1993 | Kurbikoff et al. ............ | 439/59 |
| 5,316,486 A | * | 5/1994 | Tanaka et al. ................ | 439/62 |
| 5,713,126 A | * | 2/1998 | Sakemi ........................ | 29/843 |
| 5,800,186 A | * | 9/1998 | Ramirez et al. ............. | 439/74 |
| 6,036,549 A | * | 3/2000 | Wulff .......................... | 439/660 |
| 6,053,746 A | * | 4/2000 | Yoshizawa ................... | 439/67 |

(Continued)

FOREIGN PATENT DOCUMENTS

JP 61-76683 U 5/1986

(Continued)

*Primary Examiner*—Ross Gushi
(74) *Attorney, Agent, or Firm*—Sughrue Mion, PLLC

(57) ABSTRACT

A connector device includes a plug including a plurality of plug terminals and a socket including a plurality of socket terminals. Ground plug terminals each have a recess on the contact surface, and ground socket terminals each have a dimple on the contact surface thereof. The dimple of the ground socket terminal is elastically urged to the recess of the ground plug terminal for obtaining a firm electric contact between the ground plug terminal and the ground socket terminal.

6 Claims, 4 Drawing Sheets

U.S. PATENT DOCUMENTS

| | | | |
|---|---|---|---|
| 6,086,433 A * | 7/2000 | Hils et al. | 439/849 |
| 6,099,328 A * | 8/2000 | Nelson et al. | 439/101 |
| 6,227,867 B1 * | 5/2001 | Chen et al. | 439/60 |
| 6,296,524 B1 * | 10/2001 | Goto | 439/660 |
| 6,312,265 B1 * | 11/2001 | Mohtar et al. | 439/79 |
| 6,322,373 B1 * | 11/2001 | Ohtsuki et al. | 439/67 |
| 6,369,336 B1 * | 4/2002 | Obata | 174/266 |
| 6,439,919 B1 * | 8/2002 | Yasufuku et al. | 439/377 |
| 6,517,372 B1 * | 2/2003 | Jones | 439/346 |
| 6,695,633 B2 * | 2/2004 | Longueville et al. | 439/260 |
| 6,803,656 B2 * | 10/2004 | Farnworth et al. | 257/730 |
| 6,851,953 B2 * | 2/2005 | Kamiyamane | 439/59 |
| 6,932,659 B1 * | 8/2005 | Wong | 439/853 |
| 2004/0038580 A1 * | 2/2004 | Clement | 439/346 |
| 2004/0175992 A1 * | 9/2004 | Kimata et al. | 439/637 |

FOREIGN PATENT DOCUMENTS

JP        2002-124327 A        4/2002

\* cited by examiner

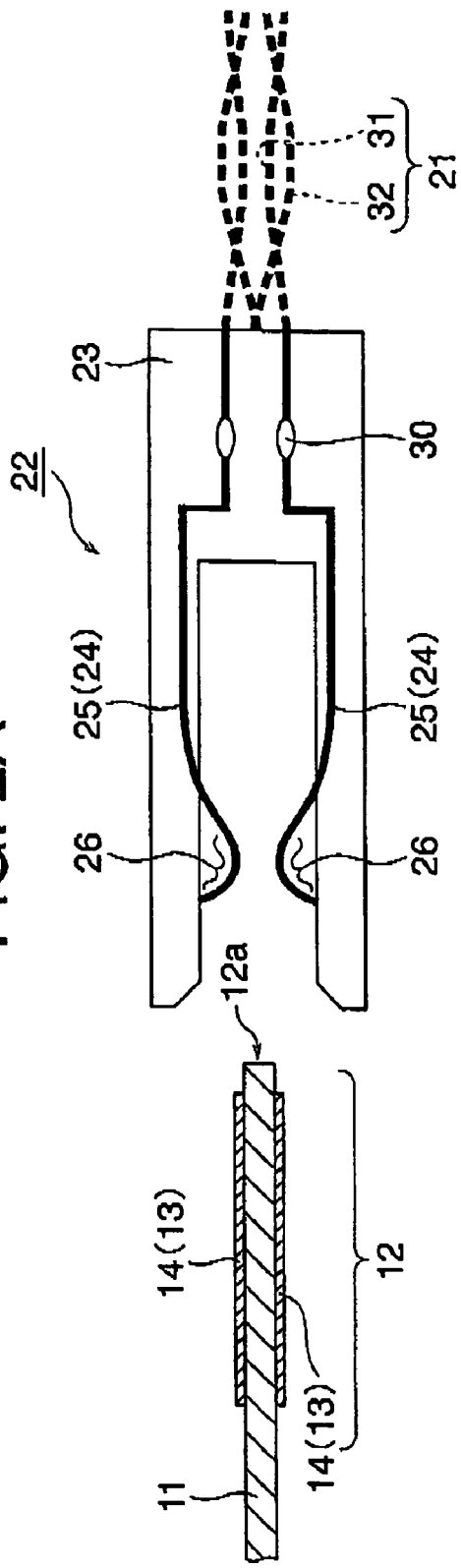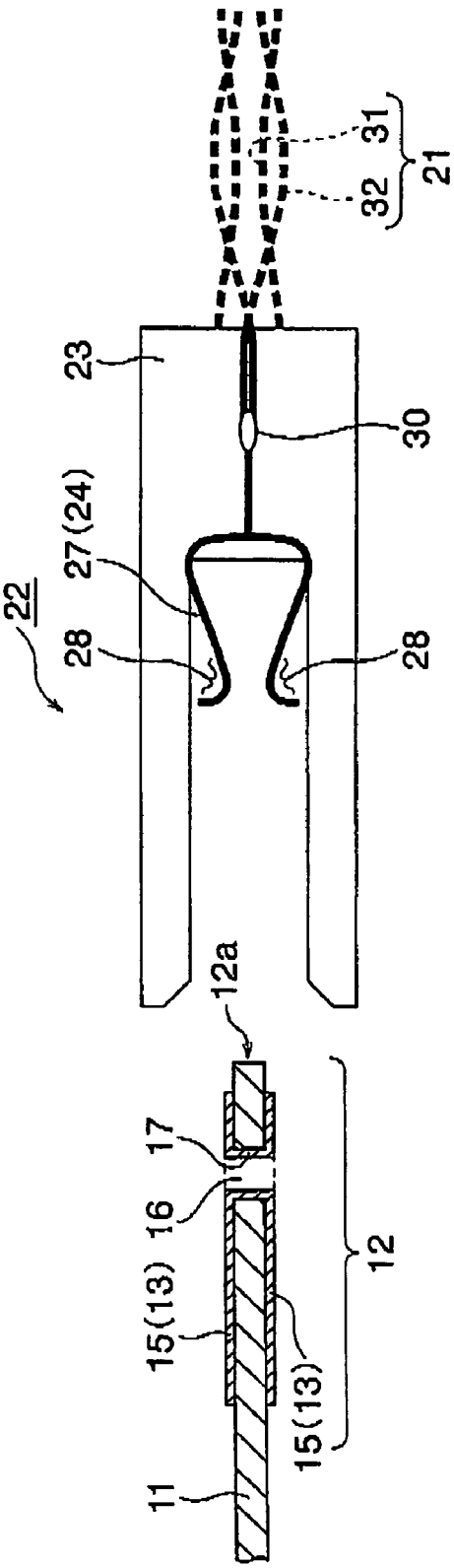

CONNECTOR DEVICE

BACKGROUND OF THE INVENTION

1. Field of the Invention

The present invention relates to a connector device including a plug and a socket, and particularly to a lock structure for locking together the plug and the socket.

2. Description of the Related Art

A card edge connector includes a combination of a plug including a plurality plug pins (plug terminals) and a socket including a plurality of socket pins (socket terminals). The plug is provided at an edge portion of a card member such as a printed circuit board. The socket pins are connected to an external circuit. The plug terminals of the card member are configured as pad electrodes. The socket terminals are configured as contact electrodes which contact surfaces of the pad electrodes when the plug of the card member is inserted into the socket. In a card edge connector, the pad electrodes are constructed as parts of printed wires of the card member. The card edge connector has a shorter wiring length, compared with a two-piece connector in which a plug is provided separately from the circuit body. Therefore, the card edge connector has an advantageous feature of capability of reducing electric loss under the condition of using high-speed signals.

Sockets for the card edge connector are divided into several types, e.g., a type of socket which is provided at an edge portion of a printed circuit board like a plug, and another type of socket which is connected to an end portion of a cable. Particularly, the latter type has a problem in that the card member easily falls off when the cable connected to the socket is pulled by an external force. Patent Publication JP-2002-124327A (FIG. 1) and Utility Model Publication JM-61-76683A (FIG. 1) describe a card edge connector having a lock structure between a card member and a socket, as a kind of card edge connector which prevents the card member from falling off from the socket. In the lock structure described in JP-2002-124327A, the card member is provided with a hook-like protrusion and the socket is provided with a pivotable lever. When the card member is inserted into the socket, the lever is shut to engage with the protrusion. In the lock structure described in JM-61-76683A, through-holes are formed outside the area in which a plurality of pad electrodes are arranged in the card member, and protrusions which engage with the through-holes are provided in the socket for locking the body of the plug and the body of the socket.

DISCLOSURE OF THE INVENTION

Problems to be Solved by the Invention

In recent years, electronic devices have been downsized. Connector devices to be mounted on electronic devices have hence been required to be downsized. To realize a connector device having a smaller size, for example, the connector device uses in many cases a serial transmission technique in place of using a conventional parallel transmission technique. This increases the signal transmission speed transmitted through the connector device.

However, if a conventional lock structure described in any of the two publications described above is adopted, there arises a problem in that the size of the connector device becomes large due to the lock structure and hinders downsizing of the connector device. The larger size impedes the higher-speed signal transmission. Another problem is that the structure of the connector device is complicated and raises the cost thereof.

In view of the above situation, it is an object of the present invention to provide a connector device having a small and simple lock structure for locking the plug and the socket.

Means for Solving the Problems

The present invention provides a connector device including a plug including a plug terminal and a socket including a socket terminal, the plug terminal having a contact surface adapted to a contact surface of the socket terminal wherein: the plug terminal has a dimple or recess on the contact surface; the socket terminal has a recess on the contact surface thereof corresponding to the dimple of the plug terminal or has a dimple on the contact surface thereof corresponding to the recess of the plug terminal; and the recess or the dimple of the socket terminal is elastically urged onto the dimple or the recess of the plug terminal.

According to the connector device of the present invention, a lock structure can be realized which locks together the plug and the socket by using the protrusion or recess which is formed on the contact surface of the plug terminal and by using the recess or protrusion which is elastically urged against and engaged with the protrusion or recess of the plug terminal. Since the lock structure is formed at the contact surfaces contacting the plug terminal with the socket terminal, the connector device having the lock structure can be downsized without enlarging the connector device for the space of the lock structure. In addition, the connector device has a simple lock structure, and therefore, the costs necessary for manufacturing the connector having the lock structure can be reduced. Moreover, the lock structure improves the electric contact between the plug terminal and the socket terminal.

BRIEF DESCRIPTION OF THE DRAWINGS

FIGS. 2A and 2B are sectional views taken along the lines a-a and b-b, respectively, shown in FIG. 1;

DETAILED DESCRIPTION OF THE PREFERRED EMBODIMENT

Figure 1:
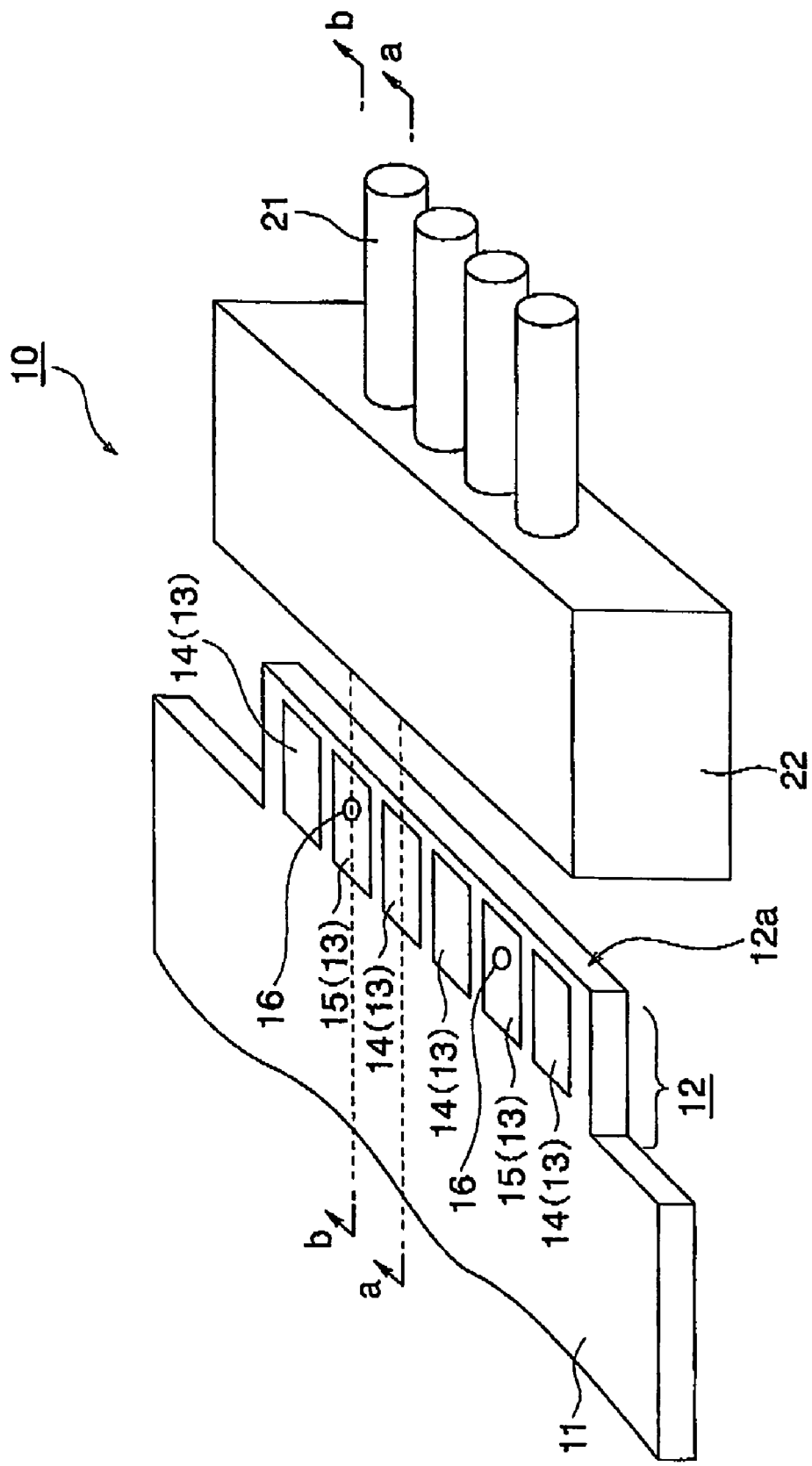
FIG. 1 is a perspective view showing the structure of a connector device according to an embodiment of the present invention.

Referring to the accompanying drawings, the present invention will now be described in detail below on the basis of an embodiment of the present invention. FIG. 1 is a perspective view showing the structure of a connector device according to the embodiment. The connector device, generally designated by numeral 10, is a card edge connector, and is configured by a combination of plug 12 and socket 22. At an edge portion of a card member 11 configured by a multilayer printed circuit board, the plug 12 is provided as a part of the multilayer printed circuit board. The socket 22 is connected to an end portion of a cable 21.

On both board surfaces of the plug 12, a plurality of pad electrodes (plug terminals) 13 are provided. The pad electrodes 13 each have a rectangular planar shape which is elongated in the direction of inserting the plug 12 into the socket 22. The pad electrodes 13 each are 2.0 mm long in the direction of the longer edge of the rectangle and 1.5 mm long in the direction of the shorter edge. The pad electrodes 13 include signal pad electrodes 14 connected to signal lines of the printed circuit board, and ground pad electrodes 15 connected to the ground line of the printed circuit board. The signal pad electrodes 14 and the ground pad electrodes 15 are arrayed in a ground strip-line structure. In order that the cross-talk noise between adjacent signal pad electrodes 14 be reduced, one of the ground pad electrodes 15 is disposed for every one or two of the signal pad electrodes 14.

The pad electrodes 13 are formed on each of the front and rear surfaces of the printed circuit board. In the ground pad electrodes 15, substantially circular through-holes 16 are formed in the vicinity of the distal end portion 12a of the plug 12. The through-holes 16 are formed penetrating the printed circuit board underlying the ground pad electrodes 16 and also penetrating the other ground pad electrodes 15 disposed on the opposite side of the printed circuit board, which is sandwiched between these ground pad electrodes 15. The through-holes 16 each have a diameter of 0.5 mm.

FIG. 2A shows a sectional view of the connector device 10 taken along the line a-a shown in FIG. 1. The socket 22 has a housing 23 for receiving therein plugs 12. Signal contact electrodes 25 corresponding to the signal pad electrodes 14 are secured to the housing 23. The signal contact electrodes 25 each have a curved portion 26 near the opening of the housing 23, the curved portion 26 being curved to protrude toward one of board surfaces of the plug 12.

FIG. 2B shows a sectional view taken along the line b-b shown in FIG. 1. Substantially U-shaped ground contact electrodes 27 corresponding to the ground pad electrodes 15 provided on the plug 12 are secured to the housing 23. The ground contact electrodes 27 each have a curved portion 28 near the distal end thereof, the curved portion 28 being curved to protrude toward the one of board surfaces of the plug 12. The ground contact electrodes 27 are disposed such that the curved portions 28 are retracted in the housing 23 from the curved portions 26 of the signal contact electrodes 25.

Figure 3A:
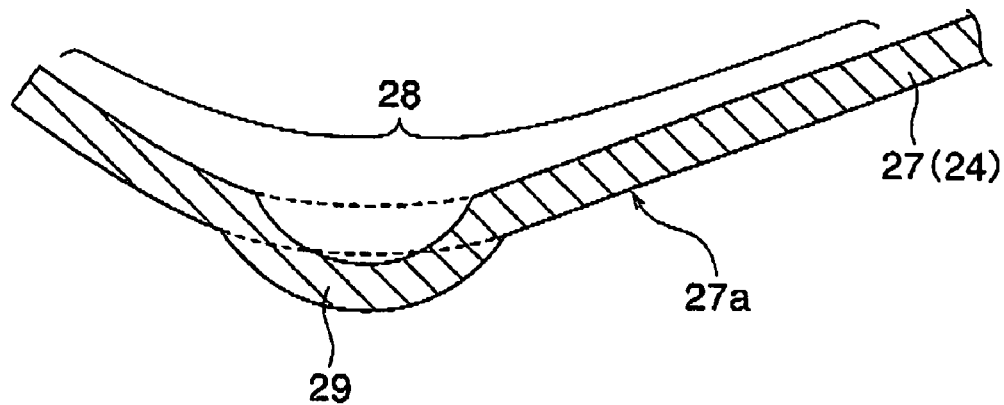
FIG. 3A is an enlarged sectional view showing the vicinity of the curved portion of the contact electrode shown in FIG. 2B.
Figure 3B:
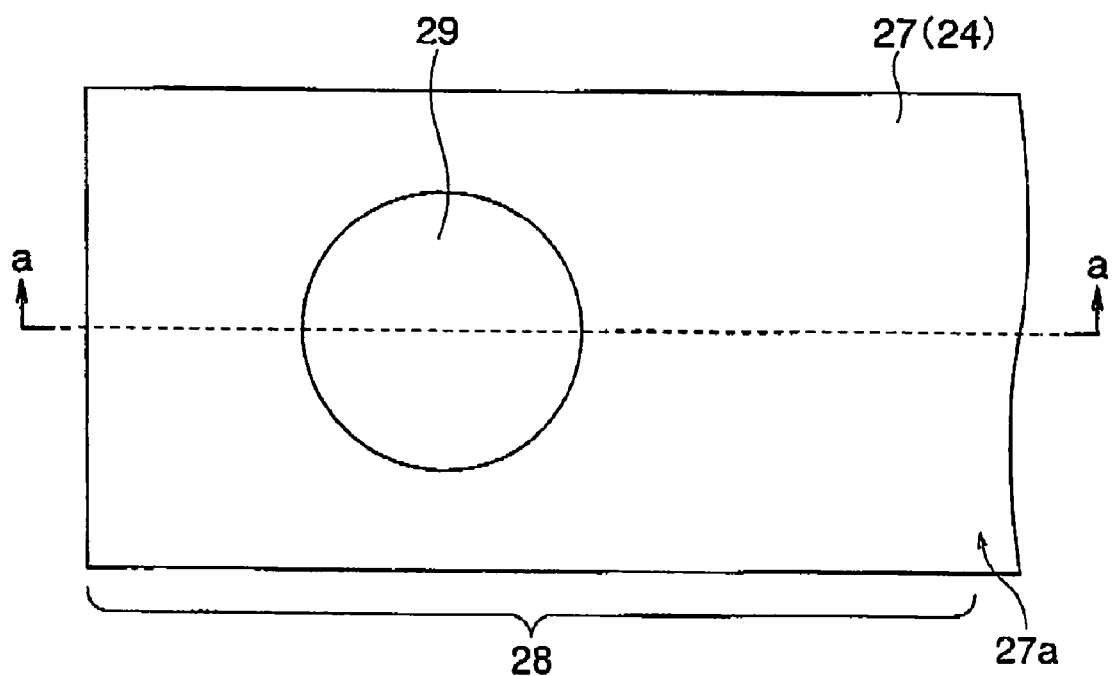
FIG. 3B is a top plan view thereof where the vicinity of the curved portion in FIG. 2B is observed from the side of the contact surface.

FIG. 3A is an enlarged sectional view showing the curved portion of the ground contact electrode 27. FIG. 3B shows a top plan view of the ground contact electrode 27 where the curved portion of the contact electrode 27 is observed from the side of the contact surface. FIG. 3A shows a sectional-view taken along the line a-a in FIG. 3B. The ground contact electrode 27 is configured as a stripe-like metal plate elongated in the direction of inserting the plug 12. At the peak portion of the curved portion 28, a dimple 29 protruding toward the board surface of the plug 12 is formed. The dimple 29 has a substantially semi-spherical shape having a diameter of around 0.6 mm. The dimple 29 is formed as by pressing the ground contact electrode 27.

Referring back to FIG. 2B, a conductive film coat 17 is formed by a plating technique on the inner wall of the through-hole 16, and is connected to a ground layer (not shown) configured by a conductive layer of the printed circuit board. The signal contact electrodes 25 and ground contact electrodes 27 are respectively connected, at the proximal ends thereof, to the signal lines 31 and ground lines 32 by using solder 30. Alternatively, the signal contact electrodes 25 and ground contact electrodes 27 may be respectively connected to the signal lines 31 and ground lines 32 by using a pressure bonding technique. The signal lines 31 and ground lines 32 are led to the outside of the housing 23 to configure lead wires. Two signal lines 31 and two ground lines 32 configure a single cable 21.

When coupling together the plug 12 and the socket 22, the distal end portion 12a of the plug 12 is aligned with the opening of the socket 22, and the plug 12 is then moved into the socket 22. As the plug 12 moves, the curved portions 26 of the signal contact electrodes 25 firstly contact the distal end portion 12a of the plug 12, and get on the board surfaces. The curved portions 26 then smoothly slide on the signal pad electrodes 14 while being kept urged against the contact surfaces of the signal pad electrodes 14. Secondly, the curved portions 28 of the ground contact electrodes 27 contact the distal end portion 12a of the plug 12, and the dimples 29 get on the board surfaces. The curved portions 28 then smoothly slide on the ground pad electrodes 15 while being kept urged against the contact surfaces of the ground pad electrodes 15.

Figure 4A:
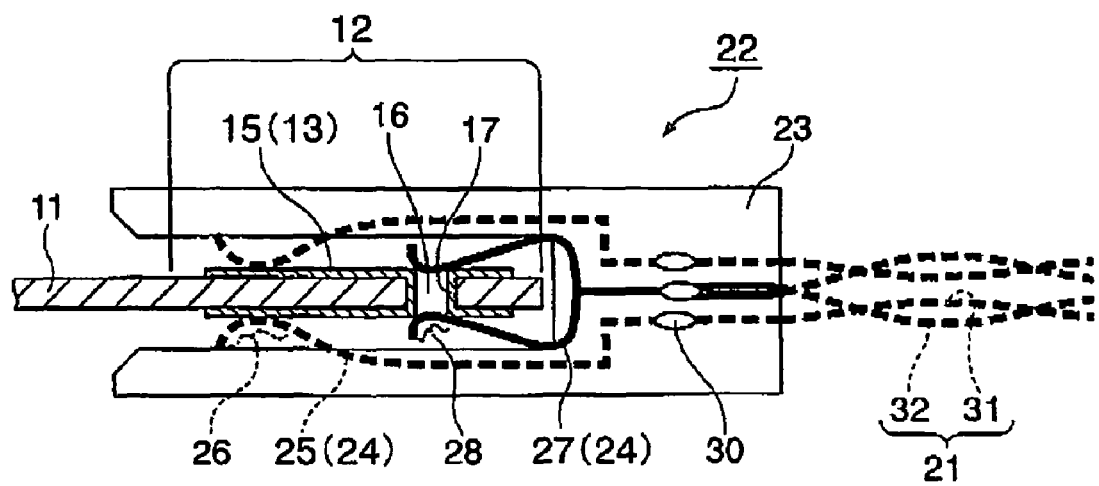
FIG. 4A is a sectional view corresponding to FIG. 2B in a state where the plug and the socket are locked together.
Figure 4B:
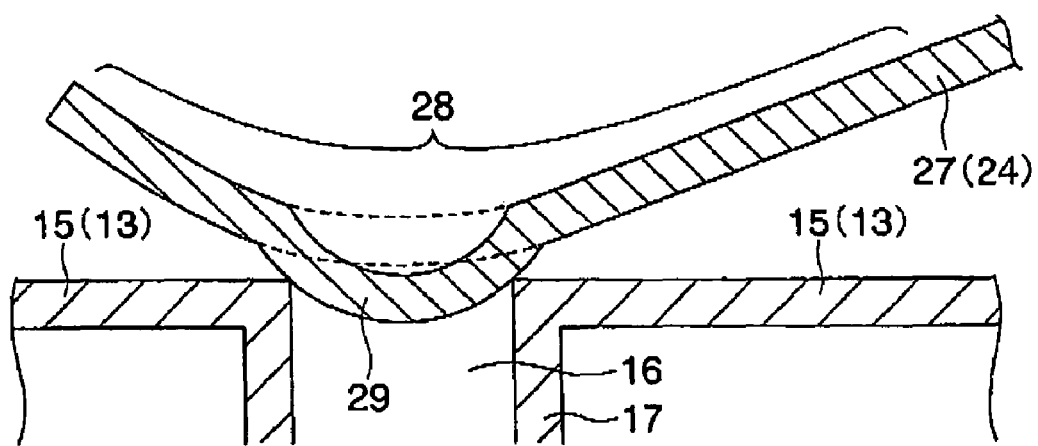
FIG. 4B is an enlarged sectional view showing the vicinity of the curved portion shown in FIG. 4A.

The dimples 29 slide through a predetermined distance on the contact surfaces of the ground pad electrodes 15, to finally engage with the through-holes 16. This state of the connector device 10 is shown in FIG. 4A. FIG. 4B shows the vicinity of the dimple shown in FIG. 4A. After the dimples 29 engage with the through-holes 16, the plug 12 and the socket 22 are locked together. At the openings of the through-holes 16 configuring recesses, the dimples 29 contact the ground pad electrodes 15, to thereby couple together the ground pad electrodes 15 and the ground contact electrodes 27 with a higher reliability.

According to the connector device 10 of the present embodiment, the through-holes 16 which engage with the dimples 29 are formed penetrating the ground pad electrodes 15. Therefore, the size of the connector device 10 need not be large. As a result, the connector device having a lock structure can be downsized, so that the packaging density of the connector device can be increased. Also, a simple lock structure to lock a plug and a socket is achieved by the normal connection operation of the connector device.

The through-holes 16 and the conductive film coats 17 can be formed in the step of forming the multilayer printed circuit board configuring the card member 11. Therefore, increase in the costs necessary for manufacture of connector devices can be reduced. The conductive film coats 17, formed on the inner walls of the through-holes 16, can efficiently contact the ground pad electrodes 15 with the ground contact electrodes 27. Accordingly, reliability of the electric connection can be improved.

In the above embodiment, the card edge connector has an arrangement of electrodes based on the ground strip-line structure, and the through-holes 16 are formed in the common ground pad electrodes 15. Therefore, even when a poor contact occurs between one of the ground pad electrodes 15 and a corresponding one of the ground contact electrodes 27, the desired electric contact can be achieved between the others of the ground pad electrodes 15 and the respective ground contact electrodes 27. Thus, electric connection between the ground pad electrodes 15 and the ground contact electrodes 27 can be assured.

In an alternative of the present embodiment, recesses may be formed in the contact surfaces of the ground pad electrodes 15, in place of the through-holes 16. In a further alternative, protrusions may be formed on the contact surfaces of the ground pad electrodes 15, and recesses to engage with the protrusions may be formed in the contact surfaces of the ground contact electrodes 27.

The present invention has been described above based on a preferred embodiment thereof. However, the connector device according to the present invention is not limited to the structure described in the above embodiment. The scope of the present invention should be considered as including those connector devices that would be derived by making various changes and modifications to the structure of the above embodiment.

What is claimed is:

1. A connector device comprising a plug including a first plug terminal and a second plug terminal each having a first contact surface, and a socket including a first socket terminal and a second socket terminal disposed on a first side of the plug and each having a first contact portion, said first contact portion of said first socket terminal being elastically urged toward said first contact surface of said first plug terminal, said first contact portion of said second socket terminal being located closer to an opening of said socket than said first contact portion of said first socket terminal and being elastically urged toward said first contact surface of said plug terminal, wherein:
   said first plug terminal has a recess on said first contact surface;
   said first socket terminal has a dimple on said first contact portion corresponding to said recess of said first plug terminal; and
   said dimple of said first socket terminal is elastically urged toward said recess of said first plug terminal to firmly engage said recess in a locked position.

2. The connector device according to claim 1, wherein said recess of said first plug terminal is a through-hole penetrating said first plug terminal.

3. The connector device according to claim 2, wherein said first plug terminal further comprises a second contact surface opposing said first contact surface with an intervention of an insulator, and said through-hole penetrates said first contact surface, said second contact surface and said insulator,
   wherein said first socket terminal further comprises a second contact portion having a dimple corresponding to said through-hole of said first plug terminal.

4. The connector device according to claim 1, wherein said plug includes at least one signal plug terminal and at least one ground plug terminal, and said first contact surface is formed on said ground plug terminal.

5. The connector device according to claim 1, wherein said or dimple is formed on a curved portion of said first socket terminal.

6. The connector device according to claim 1, wherein the first socket terminal further comprises a second contact portion opposing said first contact portion that is elastically urged toward a second contact surface of said first plug terminal, said second contact surface disposed on an opposite said of said first plug terminal from said first contact surface.

* * * * *